United States Patent [19]
Millar et al.

[11] Patent Number: 5,675,245
[45] Date of Patent: Oct. 7, 1997

[54] POWER DETECTOR USING A CONSTANT QUIESCENT VOLTAGE DIVIDER

[75] Inventors: Douglas James Millar; Tai Won Youn; Chen Zhang, all of Vancouver, Wash.

[73] Assignees: Sharp Microelectronics Technology, Inc., Camas, Wash.; Sharp Kabushiki Kaisha, Osaka, Japan

[21] Appl. No.: 529,625

[22] Filed: Sep. 15, 1995

[51] Int. Cl.$^6$ ........................................... G01R 15/10
[52] U.S. Cl. ................................. 324/95; 324/119
[58] Field of Search ........................ 324/158.1, 73.1, 324/95, 119, 132; 455/126, 127, 116; 330/130, 138, 279, 280

[56] References Cited

U.S. PATENT DOCUMENTS

| | | | |
|---|---|---|---|
| 4,523,155 | 6/1985 | Walczak et al. | 330/279 |
| 4,602,218 | 7/1986 | Vilmur et al. | 330/279 |
| 4,943,764 | 7/1990 | Szente et al. | 324/95 |
| 5,043,672 | 8/1991 | Youn | 330/129 |
| 5,204,613 | 4/1993 | Cripps et al. | 324/95 |
| 5,241,694 | 8/1993 | Vaisanen et al. | 455/126 |
| 5,337,006 | 8/1994 | Miyazaki | 330/130 |
| 5,423,081 | 6/1995 | Thiele et al. | 455/126 |

*Primary Examiner*—Vinh P. Nguyen
*Attorney, Agent, or Firm*—Gerald Maliszewski; David C. Ripma

[57] ABSTRACT

A control circuit which regulates an ac power output device. The control circuit is operatively connected to the ac power output and measures the ac signal with a diode to generate a control signal stimulus. A second diode is operatively connected to the power measuring diode so that the two diodes have the same voltage drops associated with the quiescent operation of the diodes. Quiescent voltage changes in the power measuring diode are canceled by the matching quiescent voltage change in the second diode. In this manner, power measurement errors associated with diode quiescent voltage changes are minimized.

25 Claims, 3 Drawing Sheets

POWER DETECTOR USING A CONSTANT QUIESCENT VOLTAGE DIVIDER

BACKGROUND AND SUMMARY OF THE INVENTION

The present invention relates generally to cellular telephones, and more particularly to circuitry that changes, monitors, and regulates a cellular telephone's transmitter output signal level based on the telephone's distance from the base station.

A cellular telephone operates by connecting the user to a base station through a radio frequency (RF) air link. Each base station services all the cellular phones inside the immediate surrounding area. Each area surrounding a particular base station is called a cell. Since the cellular phones are mobile, often installed in automobiles moving from cell to cell, the cellular phone network must constantly transfer individual phones between various base stations inside the overall phone network of multiple base stations. Each base station has a limited number of channels with which to communicate to the individual cellular phones. Each cell must, therefore, share channels with other cells in the phone network. Depending on the location and transmitter output power, it is possible for a cellular phone to simultaneously transmit into two cells that are using the same frequency.

Transmission into multiple cells may cause interference with other phone users on the same channel. Cellular telephone users on adjacent channels and in close physical proximity also interfere with each other. To prevent such interference, and to reduce to possibility of missed messages, cellular phones operate with a selectable transmitter output level. Therefore, the phone system operates most effectively when transmitter power can be kept to a power level just sufficient to communicate. To meet the requirements of the phone system, the transmitter output is varied as much as 32 dB. Such a high degree of transmitter control requires a wide range of selectable transmit power levels. It is the network that ultimately determines the transmitter power levels of mobile cellular phones. These decisions are broadcast to the mobile cellular phones, and the logic section of each particular cellular phone supplies a reference signal to its transmitter section corresponding to the selected power level. Proper system operation requires that each phone be able to accurately measure its own transmitter power to correct for power variations from the selected power level. Power selection, measurement, and control must be done accurately over the entire range of operating temperatures.

Transmitter power measurement and control is typically done with a closed loop automatic gain control (AGC) system. The AGC system measures the transmitted power level, compares the measured power to the a reference power level, and then makes corrections until the measured power level agrees with the reference level. Typically, a power detector circuit is used to make the power measurements. The power detector used to measure the transmitter power must meet the size restraints of a small portable phone. Often, production tolerance differences and variations in the electrical characteristics of the detection circuitry lead to errors in the measurement of the transmitter output power level. Further, even power measurement circuitry that operates within acceptable limits at ambient room temperature may develop large errors at the temperature extremes over which the phone must operate. These measurement errors result in variations of transmitter output power. Errors in the output transmitter signal can result in a phone user having insufficient power to reliably communicate to the base station. Alternately, errors resulting in the transmission of too much power can result in interference with other users in close physical proximity using the same, or a neighboring, RF frequency channel.

It is well known by those skilled in the art that a power detector can be made by rectifying an ac signal with a diode, and low pass filtering the result. Since current will not flow across a diode until a minimum voltage threshold has been met, a dc quiescent voltage is summed with the ac signal. The process of adding a dc component to meet the diode voltage threshold is often called biasing. The summed voltages allow at least a portion of the ac, or sampled RF transmitter, signal to conduct across the diode. Therefore, the detector output voltage ($V_{det}$) has a component associated with the rectified transmitter ac signal and a component associated with the dc quiescent voltage. The quiescent voltage associated with dc current flow across a diode does not remain constant as the ambient temperature changes. As a result, the component of the detector output signal associated with quiescent voltage changes. Changes in the quiescent component of the detector output signal appear as transmitter output signal changes and result in power measurement errors. When the quiescent voltage changes are large compared to the ac sample power signal, the transmitter output control is seriously affected.

Prior art devices have attempted to solve the problem of diode quiescent condition errors. Walczak et. al. U.S. Pat. No. 4,523,155 uses a second diode to compensate the detection circuitry for changes in the rectifying diode over temperature. However, the circuit is configured so that the quiescent current flow through both diodes is not equal. Power measurement errors can result from the difference in the quiescent voltage drops across the diodes over the operating temperature range.

Vilmur et. al. U.S. Pat. No. 4,602,218 approaches the diode quiescent operation problem by compressing the ac signal with a log amplifier into a limited range of diode operation to reduce variations over temperature. The circuitry has the disadvantage of being relatively complex, and requiring additional transistors, resistors, and a current source. In addition, more space is required for the placement of these components.

U.S. Pat. No. 5,043,627 invented by Youn, one of the inventors of the present device, discloses a circuit using only one diode configured to reduce the dependence of the ac power measurement on the quiescent operation of the diode. Although simple, this circuit still introduces some power measurement errors over the operating temperature range.

It would be advantageous to provide a cellular telephone that can accurately maintain a selected transmitter power output to insure a reliable RF link between a cellular phone and the base station that uses the minimum level of transmitter power.

It would also be advantageous if the power detection circuit used to measure the transmitter power could also make adjustments to protect against variations in power, especially over the extended temperature range from $-30°$ C. to $+60°$ C. over which the cellular phones must operate.

It would also be advantageous if the transmitter power measurement circuitry remained accurate over the extended temperature range so as to not add any appreciable error to the power measurements.

Further, it would be advantageous if the power measurement circuitry was small, inexpensive, and required no factory calibration.

Accordingly, the present invention provides a transmitter output power detection circuit for use in a cellular radio. The detection circuit can be used in a feedback system to provide AGC adjustment to the transmitter. In this manner, the transmitter power can be maintained at a selected output level. Thus, even as the transmitter circuitry warms up during use, or changes due to environmental conditions, the output level remains at the selected level.

The power detector circuit of the present invention uses a pair of matched diodes in a unique configuration. The configuration of components insures that variations in diode electrical characteristics due to temperature are self-canceling. Therefore, the detection circuit adds no appreciable error to the measurement of the transmitter power due to changes in the diode biasing over the operating temperature range.

In its preferred form, the power detector rectifies a sampled portion of the transmitter ac signal with a diode, and filters the resultant voltage. A second diode is connected in series with the first diode between a dc bias voltage and ground. A dc quiescent current conducts through the series connection of these diodes. This quiescent current flow forms a dc voltage divider at the circuit output port, or node ($V_{det}$). Because both diodes are in the same current path, and necessarily passing the same current, the voltage drops across both diodes are essentially equal at all temperatures. The quiescent dc voltage at the divider output remains constant so that the rectified ac voltage, representing the transmitter power, is the only cause of variations in the $V_{det}$ voltage level. In this manner, the temperature changes in the quiescent operation of the rectifying diode are removed from the measurement of the RF power level.

In its preferred form, the diodes of the present invention are a matched pair with electrical characteristics that are the same, even over temperature, to further reduce any error introduced into the RF measurement due to the quiescent operation of the rectifying diode. The detector circuit also includes resistors to limit the dc current flow. Resistors with temperature stable resistance characteristics allow the diodes to be operated at a number of selected quiescent points, and with a variety of selected bias voltages. As long as quiescent current variations over temperature are small, a variety of resistors ratios are available that still support the two diode, constant quiescent voltage, divider concept. Resistors with approximately equal resistance allow the voltage division ratio to be set at approximately halfway between the quiescent bias voltage and the ground reference to maintain a constant quiescent voltage level without regard for the degree of variation in the quiescent current over temperature.

DETAILED DESCRIPTION OF THE PREFERRED EMBODIMENT

Figure 1:
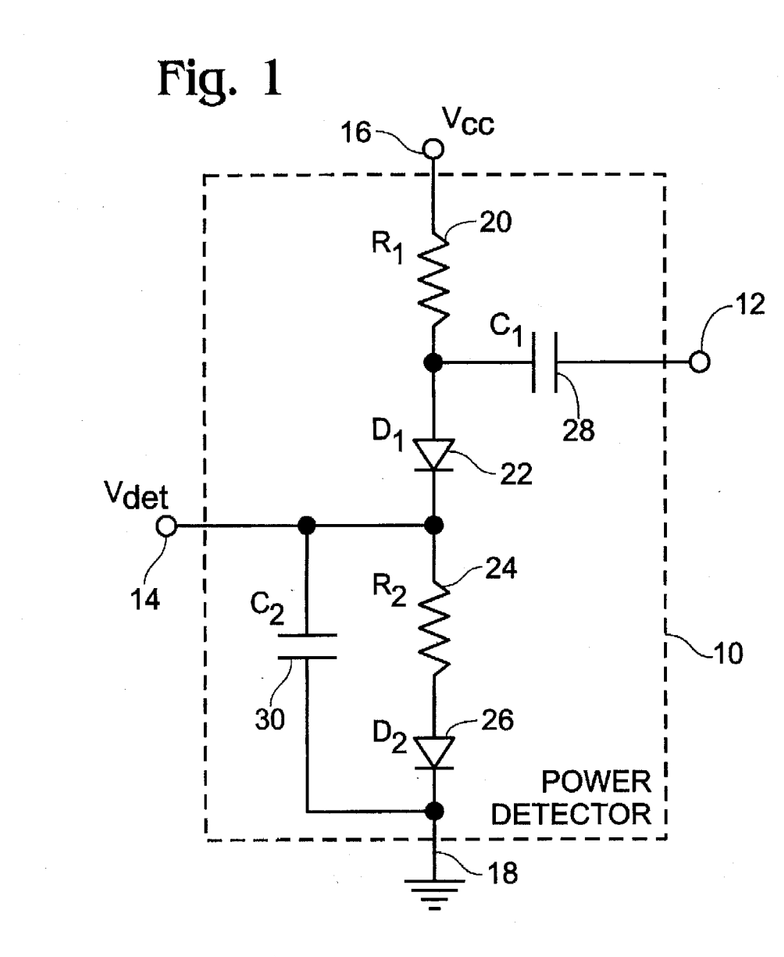
FIG. 1 is a schematic diagram of the power detector circuit employed by the present invention.

FIG. 1 is a schematic diagram showing power detector 10 which is part of an AGC or power control circuit. Detector 10 is designed to receive a sampled portion of the ac power at its input port, or node, 12. The signal at node 12 is derived from an ac, or RF power amplifier output, not shown. Power detector 10 outputs a detected voltage ($V_{det}$) at port, or node, 14 which is proportional to the RF power level at node 12. A dc, or quiescent, voltage potential for power detector 10 is established between the bias, or quiescent, voltage source introduced at node 16 and the ground, or quiescent, reference voltage introduced at node 18. Various power supply voltages and grounds in the cellular radio are the means for providing the bias voltage at node 16 and the ground reference voltage at node 18. The dc voltage potential establishes a dc, or quiescent, current flow through the series connection of diodes 22 and 26. Specifically, quiescent current flows from $V_{cc}$ at node 16 through resistor 20 to the anode of diode 22, from the cathode of diode 22 through resistor 24 to the anode of diode 26, and from the cathode of diode 26 to the ground reference voltage at node 18.

The dc biasing of diodes 22 and 26 allows the diodes to conduct so that a portion of the sampled ac power signal is conducted across diode 22. The constant dc bias on diodes 22 and 26 establishes a dc, or quiescent, component of the $V_{det}$ signal at node 14 that is independent of the rectified ac signal. Diode 22 provides the means for producing a first control signal, and diode 26 provides the means for producing a second control signal. Alternately, it can be stated that diode 22 outputs the first control signal, with its quiescent component and the component responsive to the sampled ac power. Diode 26, then, outputs the second control signal with a quiescent component that matches the quiescent component of the first control signal. $V_{det}$ can be considered to be the summation of the first control signal and the second control signal.

Since there is only one dc current path from the bias voltage at node 16 to ground at node 18, the same dc current flows through both diodes 22 and 26. Selecting diodes 22 and 26 to have matching electrical characteristics over the operating temperature range, while maintaining the same current flow through diodes 22 and 26, minimizes variations in quiescent voltage. Alternately, it can be seen that fluctuations in the quiescent voltage level at $V_{det}$, node 14, are minimized because the quiescent components of the first and second control signals remain matched.

Resistors 20 and 24 provide a means for connecting diode 22 to the bias voltage at node 16 and for connecting diodes 22 and 26 to each other. Resistors 20 and 24 also limit the current flow through diodes 22 and 26 and allow a variety of bias and ground reference voltages to be used. Either matching the resistances of the current limiting resistors 20 and 24, or varying the bias voltage, allow the quiescent operating point of the diodes to be selected. By matching the electrical characteristics of resistors 20 and 24, the quiescent voltage drops across resistor 20 and diode 22 can be kept within a predetermined range, and the quiescent voltage drop across resistor 24 and diode 26 can be kept within a predetermined range. By making resistors 20 and 24 essentially the same resistance value, the quiescent voltage across resistor 20 and diode 22 can be made essentially identical to the quiescent voltage across resistor 24 and diode 26. 1% tolerance resistors have matching electrical characteristics and essentially uniform resistances across the operating temperature range, and are preferred for this purpose. Other types of resistors can also satisfy the requirements for matching electrical characteristics. Other, two terminal, resistive elements besides resistors can also be used to provide the same function as resistors.

Capacitor 28 allows the sampled ac power to conduct from power detector input node 12 to the anode of diode 22, but blocks the flow of dc current. Diode 22 provides a means of rectifying the sampled ac, or RF, power out. The portion of the ac signal that conducts across diode 22 provides the portion of $V_{det}$ that is responsive to the ac power. Capacitor 30 is connected to the quiescent voltage return and acts in conjunction with resistor 24 to low pass filter the rectified signal conducted across diode 22. Alternately, capacitor 30 can be connected to an ac ground voltage. The rectified and filtered RF signal is summed with the quiescent dc voltage present at the power detector output port 14 to create the $V_{det}$ signal. Since the quiescent voltage level remains constant over temperature, any changes in the detected voltage correspond only to changes in the RF input signal level.

To better appreciate how the unique configuration of diodes of the present invention affect the detector output voltage, a series of annotated equations will be presented below. The following designations will be used for analysis of the circuit presented in FIG. 1:

| | |
|---|---|
| $V_{cc}$ | dc bias voltage |
| I | dc current thru diode 22 ($D_1$) and diode 26 ($D_2$) |
| $V_{d1}$ | dc voltage across diode 22 ($D_1$) |
| $V_{d2}$ | dc voltage across diode 26 ($D_2$) |
| $V_{det}$ | detector output voltage |
| T | temperature |
| $R_1$ | resistor 20 |
| $R_2$ | resistor 24 |

When no ac, or RF, signal is provided to detector circuit 10 at input port 12, the detector output voltage, $V_{det}$, at output port 14 can be written as $$V_{det}=V_{d2}+(R_2)(I) \quad (1)$$

The current can be calculated to be $$I=(V_{cc}-V_{d1}-V_{d2})/(R_1+R_2) \quad (2)$$

Since the same current, I, flows through a matched set of diodes $D_1$ and $D_2$, then $$V_{d1}=V_{d2} \quad (3)$$

Therefore, equations 1 and 2 can be written as $$V_{det}=V_{d1}+(R_2)(I) \quad (4)$$

$$I=(V_{cc}-2V_{d1})/(R_1+R_2) \quad (5)$$

Inserting equation 5 into equation 4 for I, equation 4 becomes $$V_{det} \approx V_{d1} + R_2((V_{cc} - 2V_{d1})/(R_1 + R_2)) \quad (6)$$
$$\approx V_{cc}(R_2/(R_1 + R_2)) + V_{d1}((R_1 + R_2 - 2R_2)/(R_1 + R_2)) \quad (7)$$

Assuming that resistors $R_1$ and $R_2$ have a negligible change of resistance over temperature, the detector output variation over temperature can be found by differentiating equation 7 with respect to temperature $$dV_{det}/dT=(dV_{cc}/dT)(R_2/(R_1+R_2))+(dV_{d1}/dT)((R_1-R_2)/(R_1+R_2)) \quad (8)$$

If $R_1$ is selected to be essentially equal to $R_2$, then $V_{det}$ is given by $$V_{det}=(\tfrac{1}{2})V_{cc} \quad (9)$$

$$dV_{det}/dT=(\tfrac{1}{2})(dV_{cc}/dT) \quad (10)$$

The above analysis shows that the quiescent detector output voltage $V_{det}$ at output node 14 is essentially dependent only on variations in the dc bias voltage, $V_{cc}$, introduced at node 16. Therefore, the present invention as depicted in FIG. 1, used with a $V_{cc}$ voltage that remains constant over temperature, insures that the quiescent component of the $V_{det}$ voltage remains stable over the operating temperature. Commercially available precision voltage regulators are typically used to maintain essentially constant dc voltages and so allow the power detection circuit of the present invention to essentially eliminate errors introduced with the use of a rectifying diode over an extended temperature range.

Figure 2:
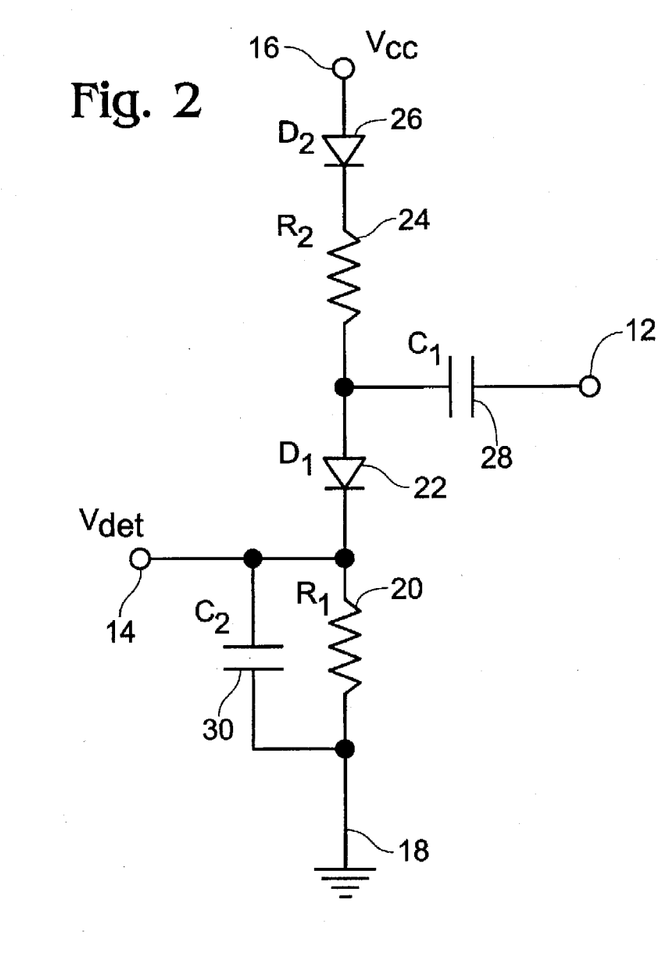
FIG. 2 is a schematic diagram of an alternate embodiment of the power detector of FIG. 1 in which the quiescent voltage divider is transposed.

Other embodiments of the invention depicted in FIG. 1 would allow the voltage divider to be rearranged so that matching diode 26 connects resistor 24 to the bias voltage at node 16, while resistor 20 connects diode 22 to ground as in FIG. 2. Further embodiments of the present invention would allow the negative voltage component of the sampled ac power signal to be rectified as is well known in the art. Another variation on the circuit would allow the resistance ratio between resistors 20 and 24 to be selected to offset, or vary, the quiescent component of the $V_{det}$ signal.

Figure 3:
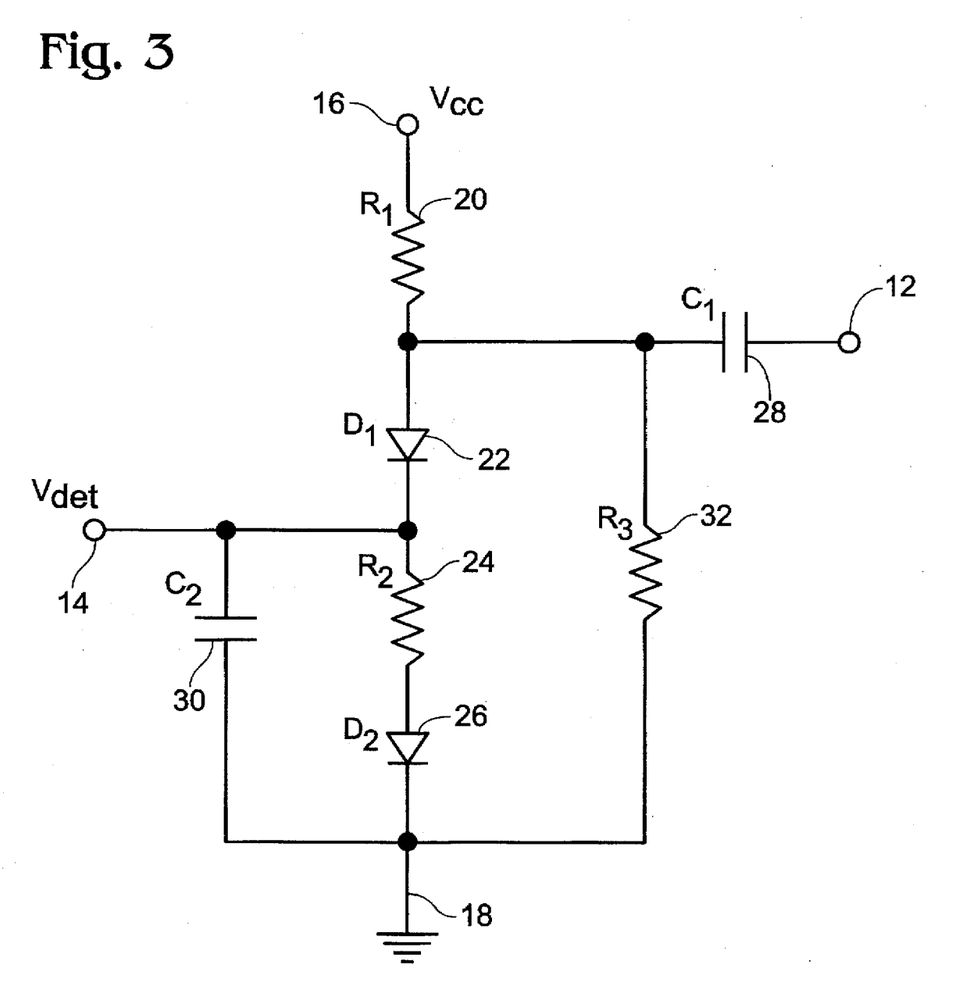
FIG. 3 is a schematic diagram of another alternate embodiment of the power detector of FIG. 1 in which the bias voltage is offset for adjusting the dynamic range of the ac power detector circuit.

FIG. 3 is yet another alternate embodiment of the present invention depicted in FIG. 1. Resistor 32 has been added to perform the $V_{det}$ dc voltage offset function. Alternately, it can be stated that the addition of resistor 32 allows the quiescent component of the first control signal to vary. Resistor 32, with resistor 20, forms a voltage divider to change the dc voltage at the circuit node formed by the intersection of resistor 20, resistor 32, and the anode of diode 22. This circuit modification of FIG. 3 has an effect similar to that of changing the $V_{cc}$ voltage at node 16 in FIG. 1. Such an offset may be necessary to optimize the dynamic range of the AGC loop or to condition the $V_{det}$ signal for interfacing other circuit components. This circuit variation also allows a variety of $V_{cc}$ voltages to be used at node 16. Diodes 22 and 26 still conduct equal amounts of current, and have equal voltage drops over temperature. Changes in the quiescent component of the $V_{det}$ signal at port 14 remain insignificant as long as the fluctuations in quiescent current flow over temperature are small compared to the overall current flow.

Figure 4:
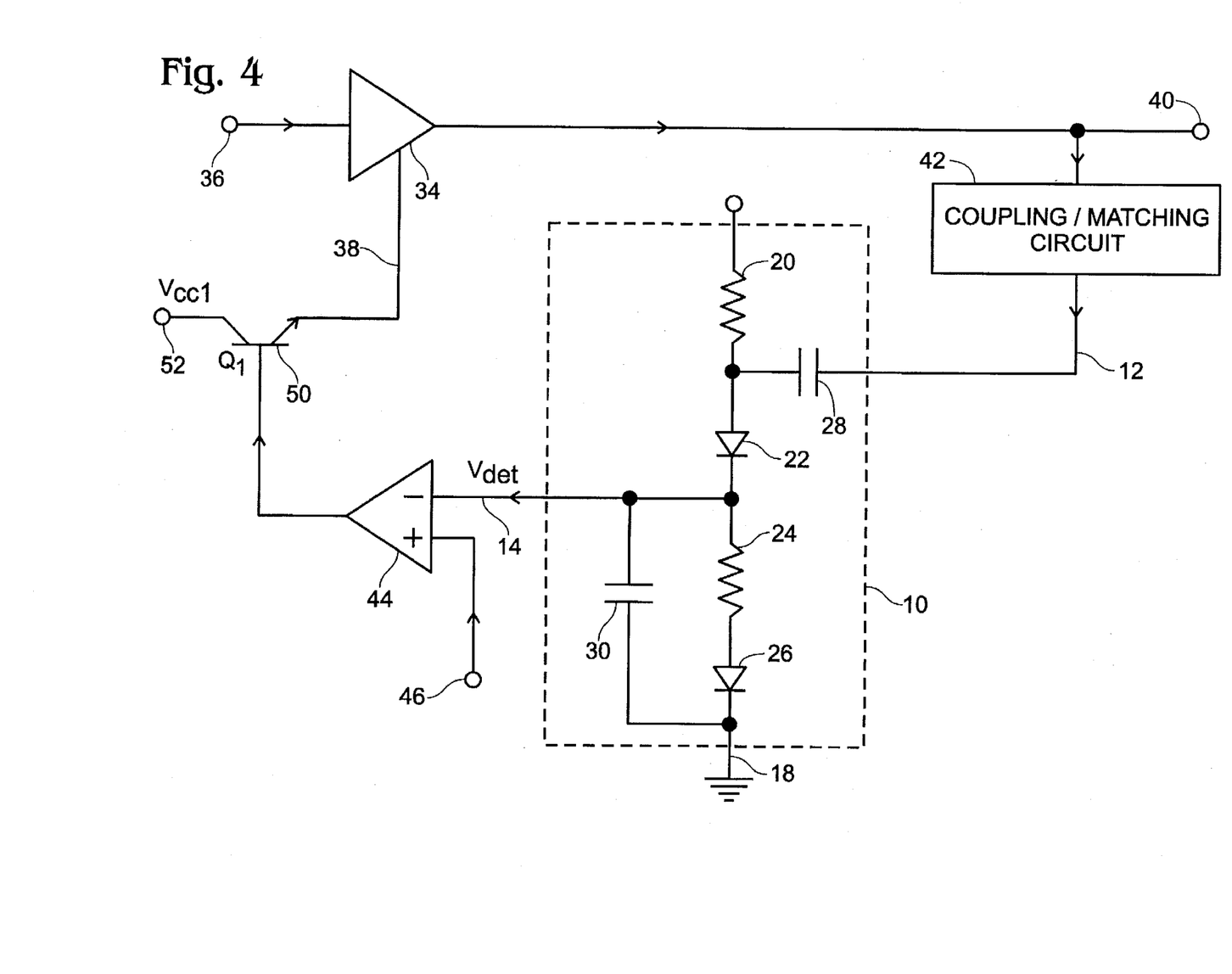
FIG. 4 is a block diagram of a RF amplifier with automatic gain control circuitry, incorporating the power detector circuitry of the present invention.

FIG. 4 is a block diagram showing a control circuit to regulate an ac, or RF, output device power level. Alternately, FIG. 4 can be considered as a depiction of a control circuit for maintaining the output level of an ac, or RF, power device 34 within a predetermined range. Specifically, a variable gain ac, or RF, power amplifier 34 with AGC circuitry to regulate the power level of RF power amplifier 34 is shown. RF power amplifier 34 has an input node, or port, 36 which receives an ac, or RF, input signal from a RF generator or from lower power RF amplifiers. RF amplifier 34 has a RF amplifier gain control port 38 regulated by the ac, or RF, power level control signal to select the amount of gain. RF amplifier 34 also has an output port 40 to supply the ac, or RF, power level.

The RF amplifier output 40 is also interfaced to the coupling circuit 42. Coupling circuit 42 operatively connects the ac, or RF, output power device output 40 to the power detector input port 12. Coupling circuitry 42 attenuates the ac power level to supply a sample portion of the ac power output level to input port 12 of the power detector circuit 10. Alternately, coupling circuitry 42 may be considered a means of sampling the ac power output 40 of an ac, or RF, power device 34 to provide a sampled ac power signal. The impedance of coupling circuitry 42 is designed to provide an optimally matched interface impedance load to the RF amplifier output node 40.

The power detector circuit 10, described in detail as FIG. 1 above, converts the sampled ac power input to the power detector 10 at port 12 into an essentially a dc voltage corresponding to the ac power level at node 14. The ac power level control signal, used to drive the RF amplifier gain control port 38, is derived from the detected power, $V_{det}$, at node 14. In the preferred embodiment of the invention, a variable gain control signal amplifier 44 is used to further condition the $V_{det}$ signal at node 14. The dual input operational simplifier 44 also allows the use of an ac, or RF, power reference signal to select the predetermined power level at RF amplifier output 40. Multiple, selectable, ac power reference signals allow the ac power output level of the cellular radio to be operated at a plurality of predetermined power levels at RF amplifier output 40. Operational amplifier 44 compares $V_{det}$ of node 14 with the selectable ac power reference signal of node 46 to determine the signal at the operational amplifier output node 48, from which the ac power level control signal is derived.

Transistor 50, with transistor bias voltage $V_{cc1}$ at node 52, can also to added to the AGC system to further condition the ac power level control signal provided to the RF amplifier gain control node 38. The AGC system works by adjusting the RF amplifier output 40 until the voltages at the operational amplifier input nodes 14 and 46 are equal. Maintaining the equilibrium between operational amplifier inputs 14 and 46 insures that the RF amplifier output 40 is maintained at a constant level corresponding to the selectable ac, or RF, power reference signal at node 46.

Although RF amplifier 34 has been depicted in FIG. 4 as a single stage device, the present invention can also be configured with multiple stages of amplification. In addition, the same AGC concept presented in FIG. 4 can also be achieved with the present invention by making RF output device 34 a variable loss RF attenuator, or multiple stages of attenuator. The attenuator would likewise have a RF input 36, a RF output 40, and a RF attenuator loss control port 38. Further, an AGC system as presented in FIG. 4, using either amplifiers or attenuators, is applicable to RF receiver systems as well as RF transmitters. Although an AGC system for control of RF devices has been presented above and in FIG. 4, the present invention can be configured with power output devices of essentially any frequency.

The present invention possesses several advantages over the prior art devices. Since the quiescent current flow through both diodes of the power detector is equal, diodes with matched electrical characteristics will act to cancel any changes of quiescent voltage over temperature. Therefore, power measurement errors associated with the change in diode quiescent voltage can be essentially eliminated. Minimizing these types of errors is critical since the cellular telephone must operate consistently in environmental extremes from −30° C. to +60° C. Further, the circuitry involved is minimal, involving just a handful of parts. The components used in the present design are also inexpensive. The use of matched diode pairs and 1% tolerance resistors, both commercially available, allow the present invention to be constructed with a minimum of cost and without a requirement for tuning or fine adjustment.

What is claimed is:

1. A control circuit and an ac power output device, said control circuit providing an ac power level control signal to regulate the power level of said ac power output device, and said control circuit comprising:

a) a first diode, operatively connected to the ac power output device, which outputs a first control signal having a quiescent signal component and a signal component which varies in response to the ac power;

b) a second diode operatively connected to said first diode which outputs a second control signal having a quiescent signal component matching the quiescent signal component of the first control signal to maintain the quiescent voltage of the first signal within a predetermined range; and c) a detected voltage node between said first and second diodes to provide the first control signal, from which the ac power level control signal is derived, whereby power measurement errors due to temperature changes are minimized.

2. An ac power level control circuit as in claim 1, including a quiescent voltage source and a quiescent reference voltage, and in which said diodes have two terminals, said terminals of said diodes are operatively connected in series between the quiescent voltage source and the quiescent reference voltage.

3. An ac power level control circuit as in claim 2, in which said first terminals of said diodes are anodes and said second terminals of said diodes are cathodes, said anode of said first diode operatively connected to the quiescent voltage source, said cathode of said first diode operatively connected to said anode of said second diode, and said cathode of said second diode operatively connected to the quiescent voltage reference.

4. A control circuit and an ac power output device, said control circuit providing an ac power level control signal to regulate the power level of said ac power output device, said control circuit comprising:

a) a quiescent voltage source and a quiescent reference voltage;

b) a first diode having two terminals, said first diode first terminal being an anode operatively connected to the quiescent voltage source, and said first diode second terminal being a cathode, said first diode operatively connected to the ac power output device to output a first control signal having a quiescent signal component and a signal component which varies in response to the ac power, the ac power level control signal being derived from the first control signal;

c) a second diode having two terminals, said second diode first terminal being an anode operatively connected in series to said first diode second terminal to output a second control signal having a quiescent signal component matching the quiescent signal component of the first control signal, and said second diode second terminal being a cathode operatively connected to the quiescent voltage reference, whereby said diodes are operatively connected in series between said quiescent voltage source and said quiescent reference voltage;

d) a first resistive element, having two terminals, operatively connecting said anode of said first diode to the quiescent voltage source; and e) a second resistive element, having two terminals, operatively connecting said cathode of said first diode to said anode of said second diode.

5. The ac power level control circuit as in claim 4, in which the resistance of said first resistive element is matched to the resistance of said second resistive element, whereby the quiescent voltage drop across said first resistive element and said first diode remains within a predetermined range over a varying operating temperature, and the quiescent voltage drop across said second resistive element and said second diode remains within a predetermined range over a varying operating temperature.

6. The ac power level control circuit as in claim 5, in which said first resistive element and said second resistive element are resistors.

7. The ac power level control circuit as in claim 6, further including a coupling circuit with two terminals, said coupling circuit first terminal operatively connected to the ac power output device to optimally match the ac power output device interface impedance, and said coupling circuit second terminal operatively connected to the anode of said first diode to provide a sample portion of the ac power output level.

8. The ac power level control circuit as in claim 7, in which the quiescent reference voltage is an ac ground voltage, and further comprising:
   a) a first capacitive element operatively connecting said second terminal of said coupling circuit to said anode of said first diode;
   b) a second capacitive element operatively connecting the cathode of said first diode to the ac ground voltage.

9. The ac power level control circuit as in claim 8, further including a variable gain control signal amplifier and an ac power reference signal, said control signal amplifier comprising:
   a) a first input port operatively connected to the first control signal;
   b) a second input port operatively connected to the ac power reference signal;
   c) an output port operatively connected to the ac power level control signal, whereby said control amplifier compares the first control signal to the ac power reference signal to determine said control amplifier output response.

10. An ac power level control circuit as in claim 9, including multiple ac power reference signals from which the ac power reference signal is selectable, allowing the ac power output level to be operated at a plurality of predetermined power levels.

11. An ac power level control circuit as in claim 10, further including a third resistor with two terminals, the first terminal of said third resistor operatively connected to the anode of said first diode, and the second terminal of said third resistor operatively connected to the quiescent voltage reference to vary the quiescent component of the first control signal.

12. An ac power level control circuit as in claim 11, further including an ac input signal, in which the ac frequency is within the radio frequency (RF) range and said ac power output device is a variable gain RF amplifier, said RF amplifier comprising:
   a) a RF signal input port to receive the RF input signal;
   b) a RF signal output port to provide the RF power output level; and
   c) a RF amplifier gain control port operatively connected to the ac power level control signal to control the gain of said RF amplifier.

13. An ac power level control circuit as in claim 11, further including an ac input signal, in which the ac frequency is within the RF range and said ac power output device is a variable loss RF attenuator, said RF attenuator comprising:
   a) a RF signal input port to receive the RF input signal;
   b) a RF signal output port to provide the RF power output level; and
   c) a RF attenuator loss control port operatively connected to the ac power level control signal to control the loss of said RF attenuator.

14. A control circuit for maintaining the output level of an ac power output device within a predetermined range with an ac power level control signal, said control circuit comprising:
   a) sampling means operatively connected to said ac power device for sampling a portion of the ac power output to provide a sampled ac power signal;
   b) first control signal means operatively connected to said sampling means for producing a first control signal having a quiescent signal component and a signal component responsive to the sampled ac power signal, the ac power level control signal being derived from the first control signal; and
   c) second control signal means operatively connected to said first control signal means for producing a second control signal having a quiescent signal component matching the quiescent signal component of the first control signal, whereby the matching of quiescent signal components allows the first control signal quiescent component to remain within a predetermined range over a varying operating temperature.

15. A control circuit for maintaining an ac power output level within a predetermined range as in claim 14, in which said first control signal means further includes means for rectifying the sampled ac power output to provide the signal component of the first control signal that is responsive to the sampled ac power signal.

16. A control circuit for maintaining an ac power output level within a predetermined range as in claim 15, in which said first control signal means is a first diode having two terminals and said second control signal means is a second diode having two terminals, said control circuit further comprising:
   a) voltage potential means for providing a bias voltage and a ground reference voltage;
   b) connecting means for operatively connecting the first terminal of said first diode to the bias voltage, and connecting means for operatively connecting the second terminal of said first diode to the first terminal of said second diode; and
   c) connecting means for operatively connecting the second terminal of said second diode to the ground reference voltage.

17. A control circuit for maintaining an ac power output level within a predetermined range as in claim 16, in which said first terminals of said diodes are anodes, and said second terminals of said diodes are cathodes, said control circuit further comprising:
   a) a first resistive means having two terminals for operatively connecting said anode of said first diode to the bias voltage; and
   b) a second resistive means having two terminals for operatively connecting said cathode of said first diode to said anode of said second diode.

18. A control circuit for maintaining an ac power output level within a predetermined range as in claim 17, in which said diodes have matching electrical characteristics over the operating temperature and said resistive means have matching electrical characteristics over the operating temperature, whereby the quiescent voltage drop across said first diode and said first resistive means remains within a predetermined range and the quiescent voltage drop across said second diode and said second resistive means remains within a predetermined range.

19. A control circuit for maintaining an ac power output level within a predetermined range as in claim 18, in which said resistive means are resistors.

20. A control circuit for maintaining an ac power output level within a predetermined range as in claim 19, said control circuit further comprising:
   a) a first capacitor having two terminals and operatively connecting said anode of said first diode to said sampling means, said first capacitor providing a conduction path for the sampled ac power signal;
   b) a second capacitor having two terminals and operatively connecting said cathode of said first diode to the ground reference voltage to low pass filter the component of the first control signal responsive to the sampled ac power signal.

21. A control circuit for maintaining an ac power output level within a predetermined range as in claim 20, in which said control circuit further includes a variable gain control signal amplifier and an ac power reference signal to select the ac power output level, said control amplifier comprising:
   a) a first input port operatively connected to the first control signal;
   b) a second input port operatively connected to the ac power reference signal; and
   c) an output port operatively connected to the ac power level control signal, whereby said control amplifier compares the first control signal to the ac power reference signal to determine the control amplifier output response.

22. A control circuit for maintaining an ac power output level within a predetermined range as in claim 21, including multiple ac power reference signals from which the ac power reference signal is selectable, allowing the ac power output level to be operated at a plurality of predetermined power levels.

23. A control circuit for maintaining an ac power output level within a predetermined range as in claim 22, further including a third resistor with two terminals operatively connecting said anode of said first diode to the ground reference voltage to vary the quiescent component of the first control signal.

24. A control circuit for maintaining an ac power output level within a predetermined range as in claim 22, further including an ac input signal, in which the ac frequency is in the RF spectrum and said ac power output device is a variable gain RF amplifier, said RF amplifier comprising:
   a) a RF signal input port to receive the RF input signal;
   b) a RF signal output port to provide the RF power output; and
   c) a RF amplifier gain control port operatively connected to the ac power level control signal to vary the gain of said RF amplifier.

25. A control circuit for maintaining an ac power output level within a predetermined range as in claim 22, further including an ac input signal, in which the ac frequency is in the RF spectrum and said ac power output device is a variable loss RF attenuator, said RF attenuator comprising:
   a) a RF signal input port to receive the RF input signal;
   b) a RF signal output port to provide the RF power output; and
   c) a RF attenuator loss control port operatively connected to the ac power level control signal to vary the loss of said RF attenuator.

* * * * *

UNITED STATES PATENT AND TRADEMARK OFFICE
CERTIFICATE OF CORRECTION

PATENT NO. : 5,675,245
DATED : October 7, 1997
INVENTOR(S) : Douglas J. Millar, Tai Won Youn and Chen Zhang It is certified that error appears in the above-indentified patent and that said Letters Patent is hereby corrected as shown below:

Column 2, line 11, "adc" should be --a dc--.

Column 4, line 13, "adc" should be --a dc--.

Column 5, line 63, "$_dV_{det/d}T$" should be --$_dV_{det}/_dT$--.
"$_dV_{cc/d}T$" should be --$_dV_{cc}/_dT$--.
"$(_dV_{d1/d}T)$" should be --$(_dV_{d1}/_dT)$--."--.

Column 6, line 3, "$_dV_{det/d}T$" should be --$_dV_{det}/_dT$--.
"$_dV_{cc/d}T$" should be --$_dV_{cc}/_dT$--.

Signed and Sealed this

Tenth Day of February, 1998

Attest:

BRUCE LEHMAN

*Attesting Officer*    *Commissioner of Patents and Trademarks*